US008638096B2

(12) United States Patent  
Zhang et al.

(10) Patent No.: US 8,638,096 B2
(45) Date of Patent: Jan. 28, 2014

(54) METHOD OF AUTOCALIBRATING PARALLEL IMAGING INTERPOLATION FROM ARBITRARY K-SPACE SAMPLING WITH NOISE CORRELATIONS WEIGHTED TO REDUCE NOISE OF RECONSTRUCTED IMAGES

(75) Inventors: Tao Zhang, Stanford, CA (US); Michael Lustig, Berkeley, CA (US); John M. Pauly, Stanford, CA (US); Shreyas S. Vasanawala, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 585 days.

(21) Appl. No.: 12/907,764

(22) Filed: Oct. 19, 2010

(65) Prior Publication Data

US 2012/0092009 A1 Apr. 19, 2012

(51) Int. Cl.
*G01R 33/56* (2006.01)

(52) U.S. Cl.
USPC ........... 324/309; 324/307; 324/312; 324/322; 382/131; 600/410

(58) Field of Classification Search
USPC .......................... 324/300–322; 600/407–435; 382/128–131; 703/2; 709/232; 342/123; 200/268

See application file for complete search history.

(56) References Cited

U.S. PATENT DOCUMENTS

| 3,049,604 A * | 8/1962 | Showalter, Jr. ............... 200/268 |
| 3,366,955 A * | 1/1968 | Mattern ......................... 342/123 |
| 8,184,879 B2 * | 5/2012 | Geier et al. .................... 382/128 |
| 8,354,844 B2 * | 1/2013 | Zaitsev et al. .................. 324/307 |
| 8,521,488 B2 * | 8/2013 | Kirby et al. ......................... 703/2 |
| 2005/0120128 A1 * | 6/2005 | Willes et al. ................... 709/232 |
| 2009/0043547 A1 * | 2/2009 | Kirby et al. ......................... 703/2 |
| 2009/0091322 A1 * | 4/2009 | Posse ............................. 324/307 |
| 2010/0034447 A1 * | 2/2010 | Geier et al. .................... 382/131 |
| 2010/0284595 A1 * | 11/2010 | Mori et al. ...................... 382/131 |
| 2011/0148410 A1 * | 6/2011 | Zaitsev et al. .................. 324/309 |
| 2012/0092009 A1 * | 4/2012 | Zhang et al. .................... 324/309 |
| 2013/0088225 A1 * | 4/2013 | Weller et al. ................... 324/307 |
| 2013/0207652 A1 * | 8/2013 | Weller et al. ................... 324/309 |

* cited by examiner

*Primary Examiner* — Melissa Koval
*Assistant Examiner* — Tiffany Fetzner
(74) *Attorney, Agent, or Firm* — Beyer Law Group LLP

(57) ABSTRACT

A computer implemented method for magnetic resonance imaging is provided. A 3D Fourier Transform acquisition is performed with two phase encode directions, wherein phase code locations are chosen so that a total number of phase encodes is less than a Nyquist rate, and closest distances between phase encode locations takes on a multiplicity of values. Readout signals are received through a multi-channel array of a plurality of receivers. An autocalibrating parallel imaging interpolation is performed and a noise correlation is generated. The noise correlation is used to weight a data consistency term of a compressed sensing iterative reconstruction. An image is created from the autocalibration parallel imaging using the weighted data consistency term. The image is displayed.

20 Claims, 6 Drawing Sheets

METHOD OF AUTOCALIBRATING PARALLEL IMAGING INTERPOLATION FROM ARBITRARY K-SPACE SAMPLING WITH NOISE CORRELATIONS WEIGHTED TO REDUCE NOISE OF RECONSTRUCTED IMAGES

GOVERNMENT RIGHTS

This invention was made with Government support under contract RR009784 awarded by the National Institutes of Health and under contract EB007715 awarded by the National Institutes of Health. The Government has certain rights in this invention.

BACKGROUND OF THE INVENTION

This invention relates generally to magnetic resonance imaging (MRI).

Magnetic resonance imaging (MRI) is a non-destructive method for the analysis of materials, and provides medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

MRI is based on nuclear spins, which can be viewed as vectors in a three-dimensional space. During an MRI process, each nuclear spin responds to four different effects: precession about the main magnetic field, nutation about an axis perpendicular to the main field, and both transverse and longitudinal relaxation. In steady-state MRI processes, a combination of these effects occurs periodically.

Compared with other modalities, such as X-ray, CT and ultrasound, MRI takes longer time, sometimes several minutes, for data acquisition to generate clinically useful images. Undesirable imaging artifacts may appear due to the long scan time. MRI using multiple receiving coils (phased array) has been introduced to shorten the scan time and increase signal to noise ratio (SNR). This fast imaging technique, known as parallel imaging (PI), can significantly accelerate data acquisition, and therefore reduce imaging artifacts and improve image quality.

Parallel imaging uses multiple receiver coils that each receives signals from a subset of the total volume and combines data of the multiple receiver coils to provide an image for a total volume.

Parallel imaging methods exploit the sensitivity of the receiver coils to accelerate MRI acquisitions. SENSE based reconstructions, as described in Pruessmann et al., "Advances in sensitivity encoding with arbitrary k-space trajectories," MRM 46(4):638-51 (2001), provide a complete general reconstruction from arbitrary k-space sampling. SENSE attempts to reconstruct the imaged object exactly, with no coil weighting. To do so, it requires an accurate explicit measurement of the coils sensitivity. The GRAPPA based reconstructions, as described in Griswold et al, "Generalized autocalibrating partially parallel acquisitions (GRAPPA)," MRM 47(6):1202-10 (2002), which is incorporated by reference for all purposes, are becoming increasingly more popular. GRAPPA type reconstructions do not attempt to reconstruct the exact original object. Instead, they attempt to reconstruct each coil image separately—a significantly relaxed requirement. Therefore it requires only implicit coils sensitivity information in the form of correlations between pixels in k-space. The correlation measurements are obtained by calibration.

U.S. Pat. No. 6,841,998 by Griswold, issued Jan. 11, 2005 entitled "Magnetic Resonance Imaging Method And Apparatus Employing Partial And Parallel Acquisition, Wherein Each Coil Produces A Complete K-Space Datasheet," which is incorporated herein by reference for all purposes, also describes a GRAPPA based reconstruction. U.S. Pat. No. 7,688,068 by Beatty, issued Mar. 30, 2010, entitled "System and Method For Using Parallel Imaging With Compressed Sensing, which is incorporated herein by reference for all purposes," discloses a parallel imaging system, which uses compressed sensing techniques to reconstruct an MR image.

SUMMARY OF THE INVENTION

In accordance with the invention, a computer implemented method for magnetic resonance imaging is provided. A 3D Fourier Transform acquisition is performed with two phase encode directions, wherein phase code locations are chosen so that a total number of phase encodes is less than a Nyquist rate, and closest distances between phase encode locations takes on a multiplicity of values. Readout signals are received through a multi-channel array of a plurality of receivers. An autocalibrating parallel imaging interpolation is performed and a noise correlation is generated. The noise correlation is used to weight a data consistency term of a compressed sensing iterative reconstruction. An image is created from the autocalibration parallel imaging using the weighted data consistency term. The image is displayed.

In another manifestation of the invention, a computer implemented method for providing magnetic resonance imaging is provided. Precessing nuclear spins in a region of a subject are excited. A plurality of response signals, representing magnetic resonance signals arising from precessing nuclear spins are simultaneously obtained, from the region respectively with a plurality of RF reception coils, with each response signal representing a pseudo random reduced data set of a totality of all of said response signals. An autocalibrating parallel imaging interpolation is performed on the plurality of response signals, and a noise correlation is generated. The noise correlation is used to suppress noise amplified by the autocalibrating parallel imaging. An image is created from the autocalibration parallel imaging with suppressed noise. The image is displayed.

The invention and objects and features thereof will be more readily apparent from the following detailed description and appended claims when taken with the drawings.

DETAILED DESCRIPTION OF ILLUSTRATED EMBODIMENTS

Many PI methods have been developed over the past years. They can be generally classified into two types. The first type of methods, like SMASH, SENSE, and SPACE RIP, require the explicit knowledge of the coil sensitivity, which may sometimes be difficult to obtain; the other type of methods like AUTO-SMASH, VD-AUTO-SMASH, and GRAPPA uses a data fitting approach so that the coil sensitivity measurement is avoided. Instead, a few autocalibration signals are needed for the data interpolation. This type of method is also called autocalibrating parallel imaging (ACPI).

One problem with PI is that the SNR of the images will be compromised in case of accelerated data acquisition. Noise will be inevitably amplified no matter what reconstruction method is used. The reduced SNR in accelerated PI may lead to undiagnosable images.

An embodiment of the invention exploits the noise correlation introduced in a GRAPPA reconstruction. The noise correlation is then used to inform a following $l_1$ optimization about the confidence levels of the GRAPPA reconstructed entries and the noise correlation. Similarly as $l_1$ SPIR-iT, the joint sparstiy of the single images in each coil is optimized. This sequential approach can effectively suppress noise, and result in high image reconstruction quality.

Technical Description

In the GRAPPA reconstruction, the unacquired data in k-space in each coil is interpolated by a linear combination of the acquired data in its neighborhood from all coils. The linear weights of the combination are calculated by a self-calibration using a set of auto-calibration signals (ACS) acquired along with the accelerated acquisition. The data interpolation process is performed coil-by-coil. Specifically, let $x_i$ represent the vector of the entire k-space grid data for the $i^{th}$ coil, y represent the vector of the entire acquired k-space grid data for all coils, and $G_i$ represent a matrix that contains the interpolation weights in the appropriate locations for the $i^{th}$ coil. Then the GRAPPA reconstruction can be simply formulated as:

$$x_i = G_i y \qquad (1)$$

Figure 1A:
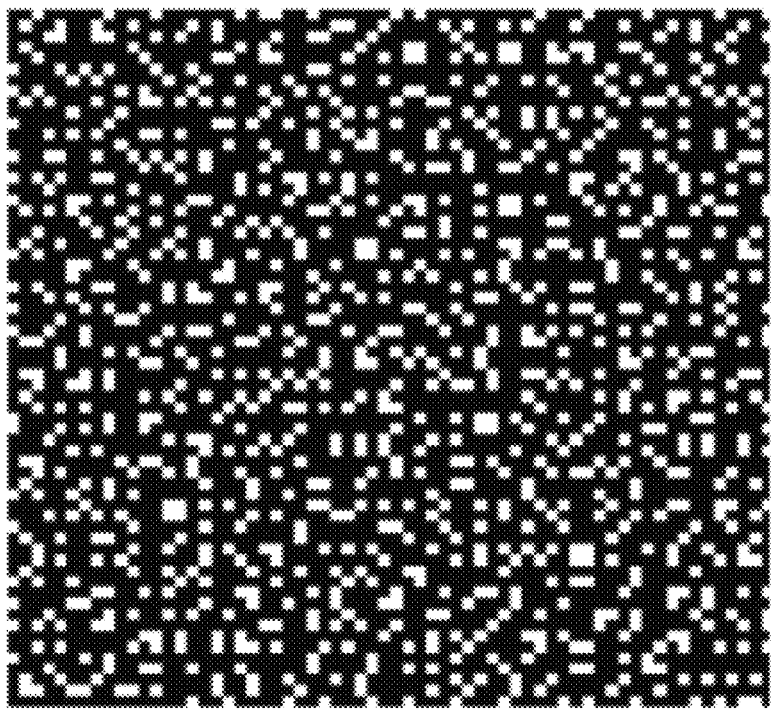
FIG. 1A illustrates an example of jittered grid undersampling pattern with acceleration factor 2×2.
Figure 1B:
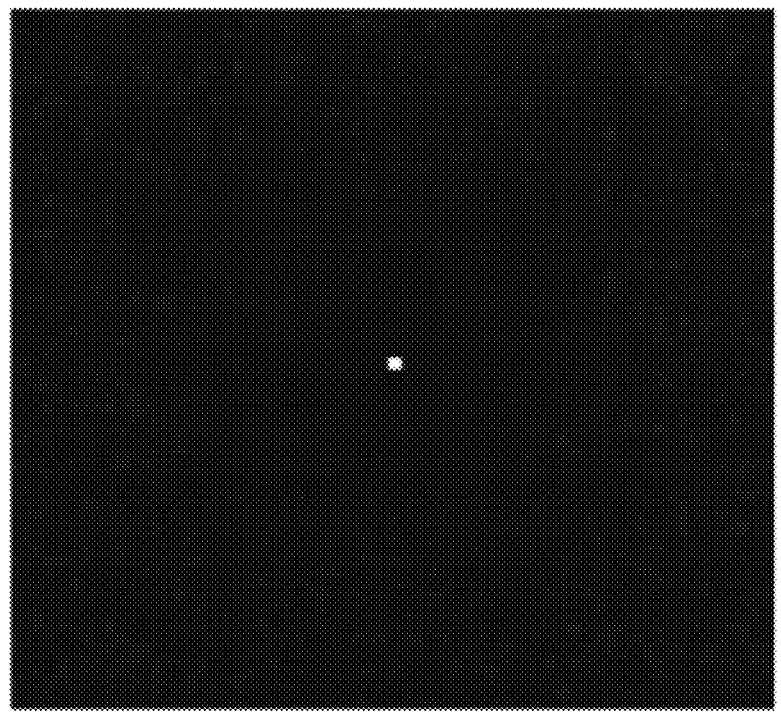
FIG. 1B is an illustration of the associated point spread function (PSF).
Figure 2:
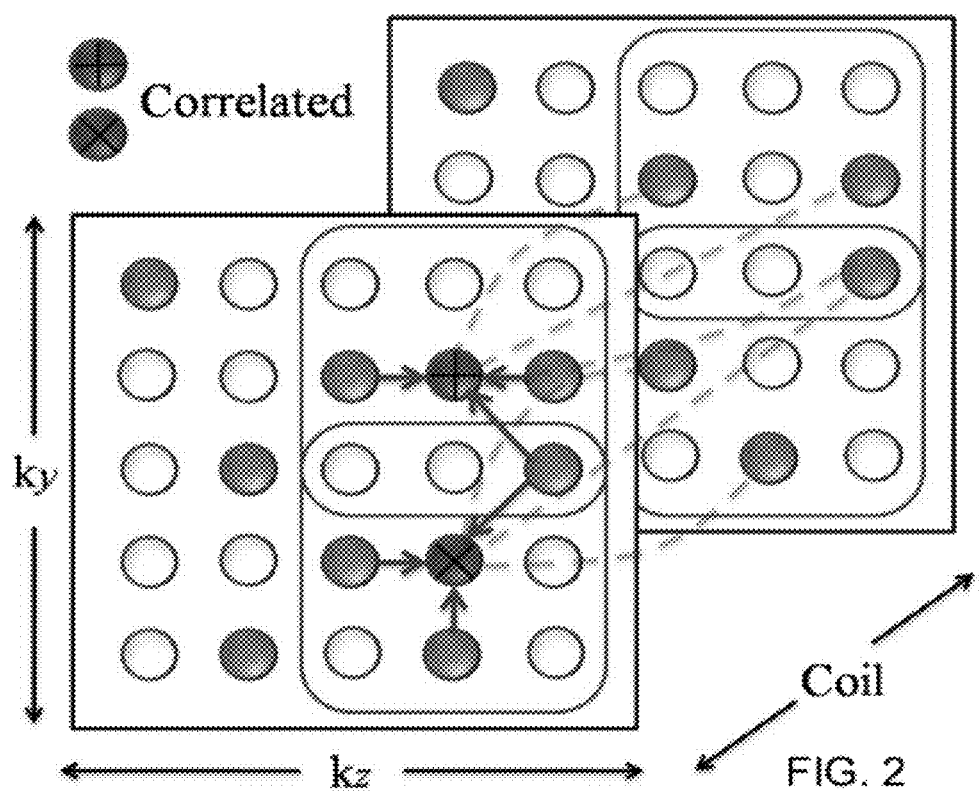
FIG. 2 shows a jittered grid undersampling, where missing k-space data is interpolated by a linear combination of acquired data in its neighborhood.

The accelerated data acquisition of parallel imaging is achieved by undersampling the k-space. Uniform undersampling patterns were originally used for accelerated PI acquisition. Recently, random undersampling patterns have also been applied, which would result in incoherent aliasing artifact. To achieve a better parallel reconstruction, the sampling pattern should not contain frequently occurring large gaps. Therefore, Poisson-disc and jittered grid with uniform or variable sampling density are two reasonable sampling patterns that could be used for PI. An example of jittered grid undersampling pattern with acceleration factor 2×2 is shown in FIG. 1A. FIG. 1B is an illustration of the associated point spread function (PSF). A 2D GRAPPA reconstruction with random undersampling pattern is illustrated as an example in FIG. 2, which shows a jittered grid undersampling, where missing k-space data is interpolated by a linear combination of acquired data in its neighborhood. The interpolated data is correlated because of the overlapped interpolation kernels. The interpolated data is correlated after GRAPPA reconstruction. Noise correlation due to overlapping of interpolation kernels can be determined by GRAPPA interpolation weights.

In practice, MRI images are normally corrupted by random noise from the acquisition process. In an embodiment of this invention GRAPPA reconstruction (a linear interpolation) is applied, then the reconstructed data and the corresponding noise are correlated after the reconstruction. Let $\epsilon$ represent the noise from the acquisition process for all the coils, then the GRAPPA reconstruction in Eq. 1 would be modified accordingly.

$$\hat{x}_i + \epsilon_i = G_i y + G_i \epsilon \qquad (2)$$

Where $\epsilon_i = G_i \epsilon$ represents the noise in the $i^{th}$ coil after GRAPPA reconstruction, and is $\hat{x}_i$ is the true signal for the ith coil.

The k-space noise $\epsilon$ can be assumed to be Gaussian distributed, $\epsilon \sim N(0, \Sigma)$, where $\epsilon$ has zero mean and covariance matrix $\Sigma$. Then after GRAPPA reconstruction, the noise $\epsilon_i$ will also be a Gaussian noise, $\epsilon_i \sim N(0, \Sigma_i)$. The covariance matrix $\Sigma_i$ for $\epsilon_i$ would be $$\Sigma_i = G_i \Sigma G_i^H \qquad (3)$$

Similarly to CS reconstruction, the denoising can be achieved by solving an optimization problem. The covariance matrix $\Sigma_i$ tells us both the confidence levels of the GRAPPA reconstructed entries and the noise correlation. One way to form the optimization problem is to exploit the joint sparsity. The optimization problem is formed as:

$$\text{minimize} \left( \sum_{i=1}^{N} \|\phi F^{-1} \hat{x}_i\|^2 \right)^{1/2}$$

$$\text{subject to } \left\| \sum_{i}^{-1/2} (\hat{x}_i - x_i) \right\| < \varepsilon$$

$$i = 1, \ldots, N$$

Where $\hat{x}_i$ is the true k-space signal for the i-th channel, and $x_i$ is the GRAPPA/ARC reconstruction for the ith channel. F is a Fourier transform operator, $\phi$ is a sparsifying transform operator.

Since the error (considered as noise) $\hat{x}_i - x_i$ is assumed to be Gaussian distributed (N (0, $\Sigma_i$)), we need to modify the data consistency constraints by a weighting of $\Sigma_i$, so that the error at each location is independent and equally-weighted.

A nonlinear conjugate gradient method is applied to solve the optimization problem. The sparse noise covariance matrix is very large in size, and it is difficult to calculate its inversion directly. Instead, we find its inversion iteratively while calculating the conjugate gradient of the objective function. The square root of the sum of squares (SSOS) images is used for the final coil combination.

Figure 3:
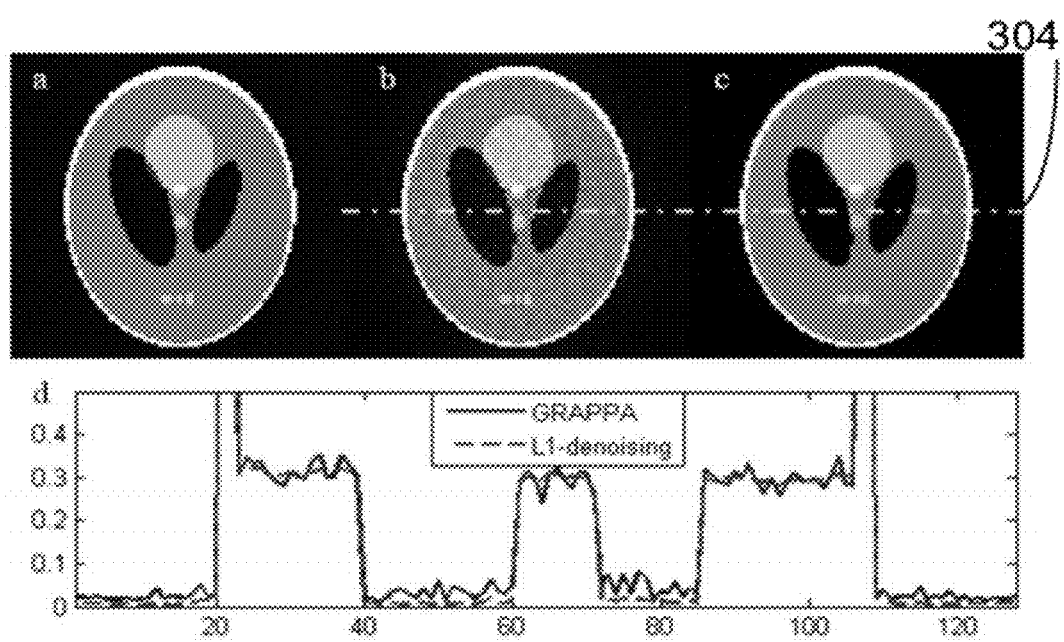
FIG. 3A shows the original image.
FIG. 3B shows a 4-fold jittered sampling GRAPPA reconstruction.
FIG. 3C shows a reconstruction by a preferred embodiment of the invention.
FIG. 3D shows 1D profiles of the marked line 304 in FIG. 3B and FIG. 3C.

Results:

A phantom simulation was performed to demonstrate a preferred embodiment of the invention. Eight-channel Shepp-Logan phantom data set (image size: 128×128) was generated with i.i.d Gaussian noise added separately into each image (SNR=50). Jittered sampling with 2×2 ($k_y \times k_z$) acceleration and autocalibrating signals 20×20 was applied. GRAPPA reconstruction was performed with interpolation kernel size 7×7. Total variation (TV) penalty was used for $l_1$ constraints. FIG. 3A shows the original image. FIG. 3B shows a 4-fold jittered sampling GRAPPA reconstruction. FIG. 3C shows a reconstruction by a preferred embodiment of the invention. FIG. 3D shows 1D profiles of the marked line 304 in FIG. 3B and FIG. 3C.

Figure 4:
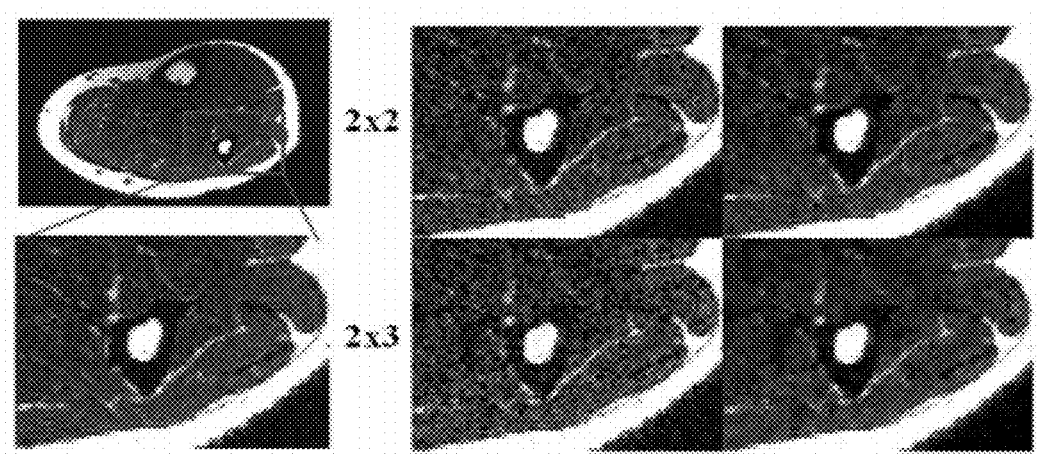
FIG. 4 shows a simulation by undersampling data from an extremity exam where jittered sampling with 2×2 and 2×3 acceleration was applied.

Similar reconstruction results were achieved by only considering the noise variance information. However, reconstruction was less accurate when no noise covariance information was used. Simulation with similar parameters as in the phantom experiment was performed on an eight-channel 3D extremity exam acquired on a 1.5T GE Signa Excite scanner. A fully sampled image, reconstruction results of GRAPPA, and results of a preferred embodiment of the invention with wavelet and TV penalties are shown in FIG. 4, which shows a simulation by undersampling data from an extremity exam where jittered sampling with 2×2 and 2×3 acceleration was applied. As can be seen, the preferred embodiment of the invention efficiently reduced the noise that was amplified during GRAPPA data synthesis.

Advantages and Improvements Over Other Methods

Compressed sensing (CS) using an $l_1$ optimization has been proved to be able to further accelerate MRI data acquisition. Methods of combining CS with PI have been performed by numerous investigators. One approach among them is to sequentially apply CS and PI, or sequentially apply PI and CS; another is to apply both PI and CS simultaneously within a single reconstruction. However, the noise correlation and amplification introduced by the PI reconstruction, especially by ACPI, has not yet been fully exploited.

The proposed method has the advantage of tracking down the noise behavior during ACPI reconstruction. This information is then used to inform the following $l_1$ optimization about the confidence levels of the reconstructed entries. Therefore, in this sequential approach, traditional ACPI can still be used without much modification. Another optimization step is carried out afterwards to suppress noise and improve image quality.

Variations Embodiments of the Invention

A preferred embodiment for $l_1$ denoising has been illustrated using a simple 3D Cartesian imaging readout. The noise covariance matrix after GRAPPA reconstruction is achieved by equation 3. The denoising is carried out on a slice-by-slice basis using nonlinear conjugate gradient method. There are several variations of this method that may be useful.

First, the inversion of the noise covariance matrix is time-consuming due to its size and matrix structure. So the appropriate approximation of the noise covariance matrix, for example, diagonal matrix approximation, could save computation cost while maintaining the image reconstruction quality.

Second, the GRAPPA reconstruction could be done using 3D kernels instead of 2D slice-by-slice kernels. This may also reduce the computation time.

Features

Some of the features provided by a preferred embodiment of the invention are the calculation of the noise correlation introduced by GRAPPA reconstruction, as well as a $l_1$ optimization that uses this noise correlation to correctly form the data consistency constraint.

A preferred embodiment of the invention provides a novel method of $l_1$ denoising autocalibrating parallel imaging has been described. The method calculates the noise correlation introduced in the traditional ACPI reconstruction, and then uses this information to form an optimization to effectively suppress noise and improve image quality.

Figure 5:
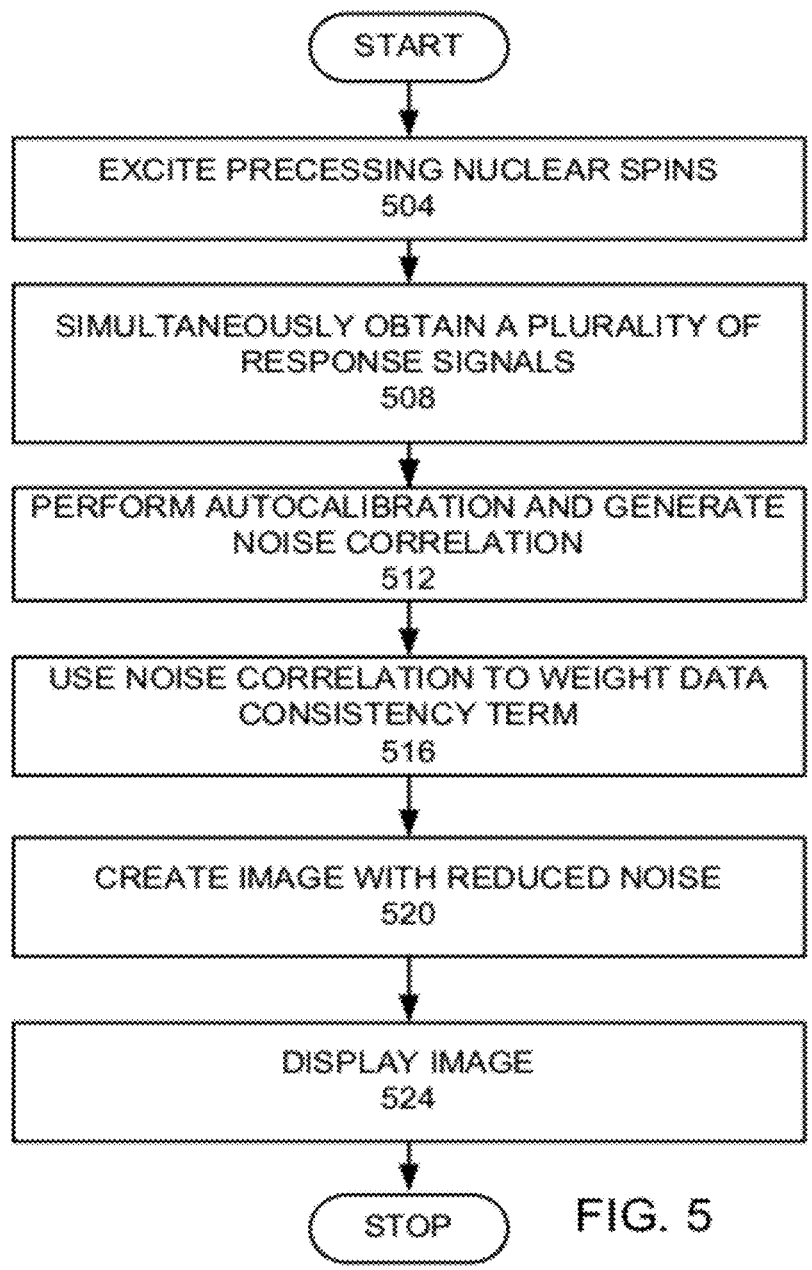
FIG. 5 is a flow chart of an embodiment of the invention.

To facilitate the understanding of the invention, FIG. 5 is a high level flow chart of an embodiment of the invention. For each k-space segment, a transient signal acquisition is applied to a selected volume of an object. In one embodiment, the transition signal acquisition comprises performing a 3D Fourier Transform acquisition with two phase encode directions, where phase encode locations are chosen so that a total number of phase encodes is less than the Nyquist rate, and closest distance between phase encode locations takes on a multiplicity of values. Preferably the multiplicity of values is greater than 10 different values. In a more preferred embodiment of the invention, the phase encode locations are chosen in a pseudo-random pattern. The pseudo-random pattern in two phase encode directions in an example of the invention provides a jittered grid, such as the jitter grid shown in FIG. 1A. Generally, the acquisition follows an excitation of the volume of the object being imaged (step 504). A plurality of signals is obtained (step 508). In the preferred embodiment, the plurality of signals are magnetic resonance signals arising from the precessing nuclear spins from the region of the volume of the object respectively with a plurality of RF reception coils with each response signal representing a pseudo random reduced data set of a totality of all of the response signals and where data is received from the readout signals. More preferably, the plurality of signals is readout signals received through a multi-channel array of a plurality of receivers. An autocalibration is performed on data from the readout signals, while a noise correlation is generated from the autocalibration (step 512). Preferably, the autocalibration is an autocalibration parallel imaging interpolation of data from the readout signals. More preferably, the autocalibration is one of GRAPPA and ARC (Autocalibrating Reconstruction for Cartesian imaging). The major difference between ARC and GRAPPA is that GRAPPA does the 3D data synthesis in k-space, while ARC does an inverse Fourier transform along the fully sampled readout direction, and then does an equivalent 2D data synthesis at each location along the readout direction. ARC is used by GE (General Electric) for autocalibrating parallel imaging reconstruction. The generated noise correlation is used to weight a data consistency term of a compressed sensing iterative reconstruction (step 516) and which is used to generate an image with reduced noise (step 520). The generated image is displayed (step 524). In this embodiment, the image may be displayed on a monitor or be displayed as a printed image. In other embodiments, images may be displayed in other ways.

Figure 6:
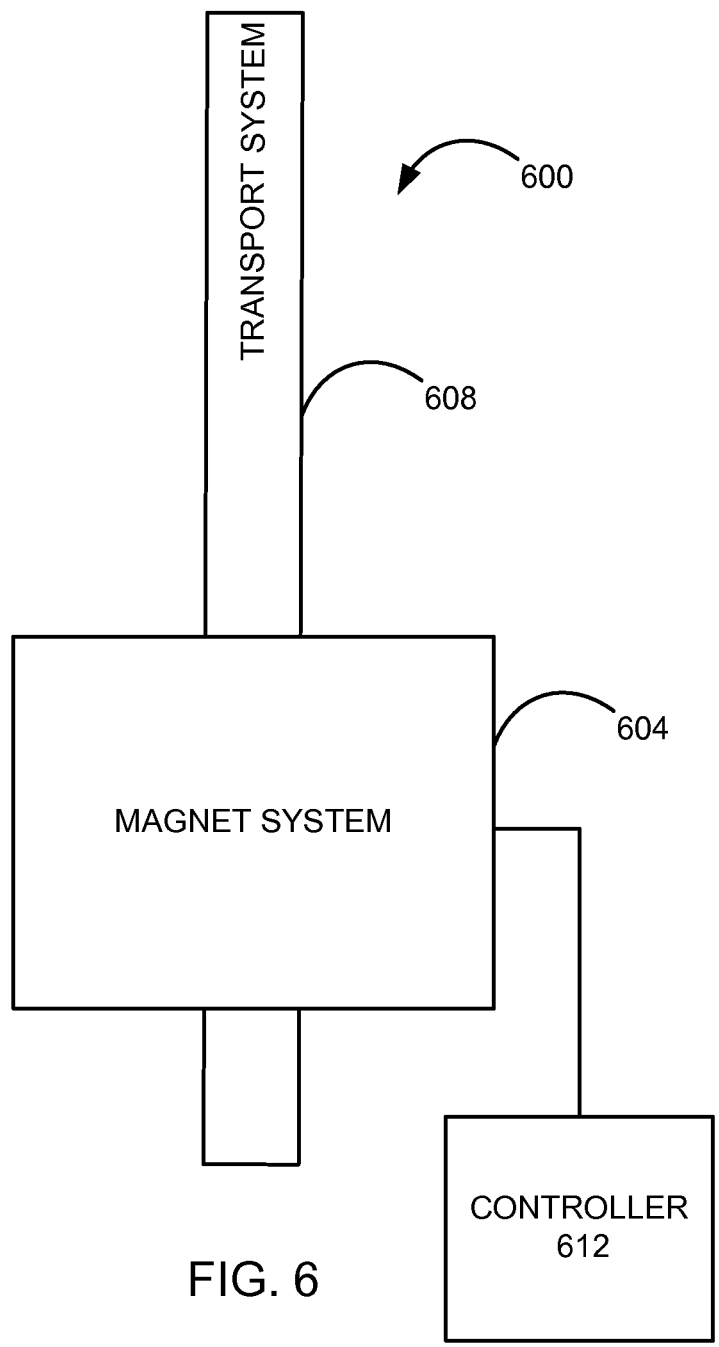
FIG. 6 is a schematic top view of a magnetic resonance imaging (MRI) system that may be used in an embodiment of the invention.

FIG. 6 is a schematic top view of a magnetic resonance imaging (MRI) system 600 that may be used in an embodiment of the invention. The MRI system 600 comprises a magnet system 604, a patient transport table 608 connected to the magnet system, and a controller 612 controllably connected to the magnet system. In one example, a patient would lie on the patient transport table 608 and the magnet system 604 would pass around the patient. The controller 612 would control magnetic fields and radio frequency (RF) signals provided by the magnet system 604 and would receive signals from detectors in the magnet system 604.

Figure 7A:
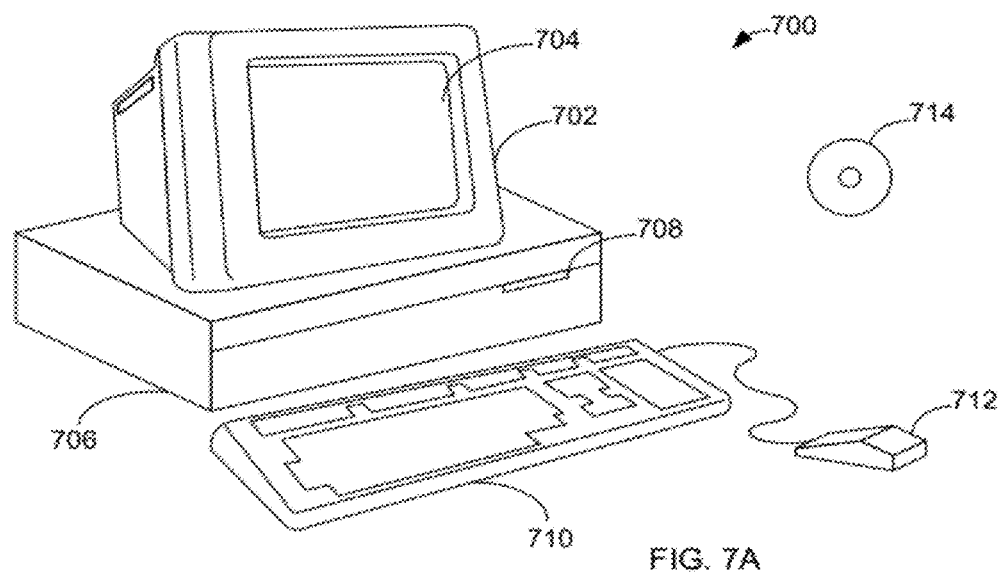
FIGS. 7A and 7B illustrate a computer system that may be used in an embodiment of the invention.
Figure 7B:
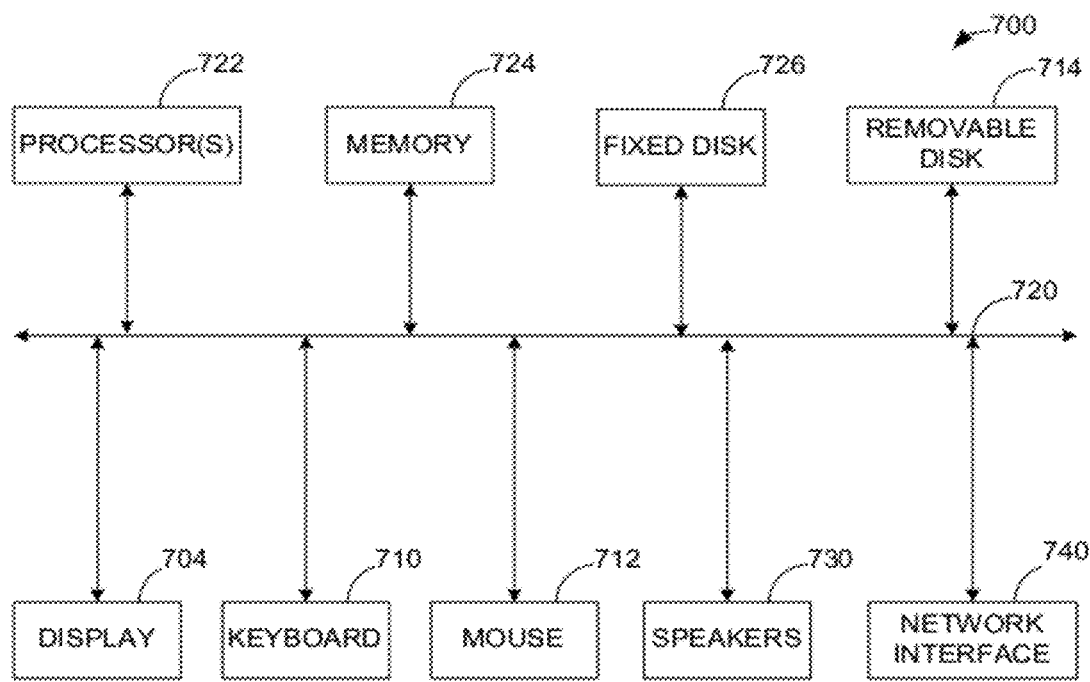

FIGS. 7A and 7B illustrate a computer system 700, which is suitable for implementing a controller 612 used in embodiments of the present invention. FIG. 7A shows one possible physical form of the computer system. Of course, the computer system may have many physical forms ranging from an integrated circuit, a printed circuit board, and a small handheld device up to a huge super computer. Computer system 700 includes a monitor 702, a display 704, a housing 706, a disk drive 708, a keyboard 710, and a mouse 712. Disk 714 is a computer-readable medium used to transfer data to and from computer system 700.

FIG. 7B is an example of a block diagram for computer system 700. Attached to system bus 720 are a wide variety of subsystems. Processor(s) 722 (also referred to as central processing units, or CPUs) are coupled to storage devices, including memory 724. Memory 724 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 726 is also coupled bi-directionally to CPU 722; it provides additional data storage capacity and may also include any of the computer-readable media described below. Fixed disk 726 may be used to store programs, data, and the like and is typically a secondary storage medium (such as a hard disk) that is slower than primary storage. It will be appreciated that the information retained within fixed disk 726 may, in appropriate cases, be incorporated in standard fashion as virtual memory in memory 724. Removable disk 714 may take the form of the computer-readable media described below.

CPU 722 is also coupled to a variety of input/output devices, such as display 704, keyboard 710, mouse 712, and speakers 730. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 722 optionally may be coupled to another computer or telecommunications network using network interface 740. With such a network interface, it is contemplated that the CPU might receive information from the network, or might output information to the network in the course of performing the above-described method steps. Furthermore, method embodiments of the present invention may execute solely upon CPU 722 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Preferred embodiments of the invention have been described at a workshop on Oct. 23, 2009, entitled "$L_1$-denoised Auto-calibrating Parallel Imaging," by Tao Zhang, Michael Lustig, and John Pauly and in an article entitled "$L_1$-denoised Auto-calibrating Parallel Imaging," by Tao Zhang, Michael Lustig, Shreyas Vasanawala, and John Pauly in Proc. Intl. Soc. Mag. Reson. Med. 18 (2010) 4883, published in May 2010, which are all incorporated by reference for all purposes.

It is believed that providing a nonuniform sampling is a necessary part of the invention to help remove artifacts. To provide nonuniform sampling, the closest distances between phase encode locations must be a multiplicity of values, such as more than 10 different values. A preferred way to do this is by using pseudo-random sampling to obtain the phase encode locations. A preferred way of obtaining pseudo-random sampling is by using a Poisson-disc or a jittered grid sampling pattern.

Autocalibrating parallel imaging (GRAPPA/ARC) introduces data correlation and noise correlation during data synthesis. Assuming the reconstruction error of GRAPPA/ARC compared to the true data is mainly coming from noise, a weighted data consistency term by the inversion of the noise covariance matrix is applied in the compressed sensing-like optimization, so that the error at each location is independent and equally-weighted after the weighting.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A Non-transitory computer implemented method of magnetic resonance imaging (MRI) in an MRI system, comprising:
    performing a 3D Fourier Transform acquisition with two phase encode directions in the MRI system, wherein phase code locations are chosen so that a total number of phase encodes is less than a Nyquist rate, and closest distances between the phase encode locations, in each of the two phase encode directions, each take on a multiplicity of values;
    receiving readout signals through a multi-channel array of a plurality of receivers of the MRI system;
    performing an autocalibrating parallel imaging interpolation for each channel of the multi-channel array in order to reconstruct data;
    generating a noise correlation between, the reconstructed data of the multi-channel array after performing the autocalibrating parallel imaging interpolation and from the autocalibrating parallel imaging interpolation;
    using of the noise correlation in order to suppress noise amplified by the autocalibrating parallel imaging by using the noise correlation in order to weight a data consistency term of a compressed sensing iterative reconstruction;
    creating an image from the autocalibration parallel imaging using the noise-weighted data consistency term on the autocalibrating parallel imaging interpolation; and
    displaying the image through the MRI system.

2. The Non-transitory computer implemented method, as recited in claim 1, wherein the autocalibrating parallel imaging interpolation comprises one of GRAPPA or ARC.

3. The Non-transitory computer implemented method, as recited in claim 2 wherein the multiplicity of values is at least 10 different values.

4. The Non-transitory computer implemented method, as recited in claim 3, wherein the phase encode locations are chosen in a pseudo-random pattern.

5. The Non-transitory computer implemented method, as recited in claim 4, wherein the pseudo-random pattern is one of a Poisson-disc or a jittered grid sampling pattern with uniform or variable sampling density.

6. The Non-transitory computer implemented method, as recited in claim 4, wherein performing the autocalibration parallel imaging interpolation provides a noise covariance matrix of the reconstructed data that provides both the confidence level of reconstruction entries and noise correlation.

7. The Non-transitory computer implemented method, as recited in claim 5, wherein the using of the noise correlation to suppress noise amplified by the autocalibrating parallel imaging comprises applying a de-noising on a slice-by-slice basis using a nonlinear conjugate gradient optimization method.

8. The Non-transitory computer implemented method, as recited in claim 5, wherein the using of the noise correlation to suppress noise amplified by the autocalibrating parallel imaging comprises using a L1 optimization that uses this noise correlation to correctly form a data consistency constraint.

9. The Non-transitory computer implemented method, as recited in claim 1, wherein the performing an autocalibrating parallel imaging interpolation and generating a noise correlation uses a GRAPPA interpolation with a 3D kernel.

10. The Non-transitory computer implemented method, as recited in claim 1, wherein performing the autocalibration parallel imaging interpolation provides a noise covariance matrix of the reconstructed data that provides both the confidence level of reconstruction entries and noise correlation.

11. The Non-transitory computer implemented method, as recited in claim 1, wherein the phase encode directions are chosen in a pseudo-random pattern.

12. The Non-transitory computer implemented method, as recited in claim 1, wherein the using of the noise correlation to suppress noise amplified by the autocalibrating parallel imaging comprises applying a de-noising on a slice-by-slice basis using a nonlinear conjugate gradient optimization method.

13. The Non-transitory computer implemented method, as recited in claim 1, wherein the using of the noise correlation to suppress noise amplified by the autocalibrating parallel imaging comprises using a L1 optimization that uses this noise correlation to correctly form a data consistency constraint.

14. A Non-transitory computer implemented method for providing magnetic resonance imaging (MRI) in an MRI system, comprising:

a) exciting precessing nuclear spins in a region of a subject in the MRI system;
b) simultaneously obtaining a plurality of response signals, representing magnetic resonance signals arising from precessing nuclear spins, from the region respectively with a plurality of RF reception coils of the MRI system, with each response signal representing a pseudo random reduced data set of a totality of all of said response signals;
c) performing an autocalibrating parallel imaging interpolation on the plurality of response signals for each channel of the multi-channel array in order to reconstruct data; and
d) generating a noise correlation between the reconstructed data of the multi-channel array from the autocalibrating parallel imaging interpolation;
e) using the noise correlation in order to suppress noise amplified by the autocalibrating parallel imaging;
f) creating an image from the autocalibration parallel imaging with suppressed noise; and
g) displaying the image through the MRI system.

15. The Non-transitory computer implemented method, as recited in claim 14, wherein the autocalibrating parallel imaging interpolation comprises one of GRAPPA or ARC.

16. The Non-transitory computer implemented method, as recited in claim 14, wherein performing the autocalibration parallel imaging interpolation provides a noise covariance matrix of the reconstructed data that provides both the confidence level of reconstruction entries and noise correlation.

17. The Non-transitory computer implemented method, as recited in claim 14, further comprising applying a compressed-sensing optimization using the noise correlation.

18. Non-transitory The computer implemented method, as recited in claim 14, wherein the using of the noise correlation in order to suppress noise amplified by the autocalibrating parallel imaging comprises applying a de-noising on a slice-by-slice basis using a nonlinear conjugate gradient optimization method.

19. The Non-transitory computer implemented method, as recited in claim 14, wherein the using the noise correlation in order to suppress noise amplified by the autocalibrating parallel imaging comprises using a $L_1$ optimization that uses this noise correlation in order to correctly form a data consistency constraint.

20. The Non-transitory computer implemented method, as recited in claim 14, wherein the performing an autocalibrating parallel imaging interpolation and generating a noise correlation uses a GRAPPA interpolation with a 3D kernel.

* * * * *

UNITED STATES PATENT AND TRADEMARK OFFICE
CERTIFICATE OF CORRECTION

Page 1 of 1

PATENT NO. : 8,638,096 B2
APPLICATION NO. : 12/907764
DATED : January 28, 2014
INVENTOR(S) : Zhang et al.

It is certified that error appears in the above-identified patent and that said Letters Patent is hereby corrected as shown below:

In the Specification:

Please replace Column 1, Line No. 10-14 with

--This invention was made with Government support under contracts EB007715, EB009690, and RR009784 awarded by the National Institutes of Health. The Government has certain rights in the invention.--

Signed and Sealed this
Twelfth Day of April, 2016

Michelle K. Lee
*Director of the United States Patent and Trademark Office*